United States Patent
Kawanami (10) Patent No.: US 9,910,371 B2
(45) Date of Patent: Mar. 6, 2018

(54) EXPOSURE APPARATUS, EXPOSURE METHOD, AND DEVICE MANUFACTURING METHOD

(71) Applicant: CANON KABUSHIKI KAISHA, Tokyo (JP)

(72) Inventor: Kentaro Kawanami, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/208,659

(22) Filed: Jul. 13, 2016

(65) Prior Publication Data
US 2017/0017167 A1      Jan. 19, 2017

(30) Foreign Application Priority Data
Jul. 16, 2015   (JP) .................................. 2015-142386

(51) Int. Cl.
| | |
|---|---|
| G03B 27/32 | (2006.01) |
| G03B 27/52 | (2006.01) |
| G03B 27/58 | (2006.01) |
| G03B 27/74 | (2006.01) |
| G03F 9/00 | (2006.01) |
| G03F 7/20 | (2006.01) |

(52) U.S. Cl.
CPC ........ *G03F 9/7026* (2013.01); *G03F 7/70516* (2013.01); *G03F 7/70641* (2013.01); *G03F 7/70725* (2013.01); *G03F 9/7019* (2013.01)

(58) Field of Classification Search
CPC ............. G03F 7/70516; G03F 7/70641; G03F 7/70725; G03F 9/7019; G03F 9/7026
USPC ................... 355/55, 67, 68, 72, 77; 356/123
See application file for complete search history.

(56) References Cited

U.S. PATENT DOCUMENTS 4,561,773 A * 12/1985 Sato ...................... G03F 9/7026
                                                                  355/43

FOREIGN PATENT DOCUMENTS

JP          H04-348019 A      12/1992

\* cited by examiner

*Primary Examiner* — Colin Kreutzer
(74) *Attorney, Agent, or Firm* — Rossi, Kimms & McDowell LLP

(57) ABSTRACT

An exposure apparatus obtains information on a relationship between a moving amount of a substrate stage in the first direction and an amount of a positional shift in an image of a mask-side reference mark projected on a substrate-side reference mark by a projection optical system in the second direction perpendicular to an optical axis of the projection optical system with respect to the substrate-side reference mark. A controller determines a focus position based on the measurement result by causing the measurement device to measure the light amount while, together with driving the substrate stage in the first direction and the second direction based on the information.

14 Claims, 7 Drawing Sheets

PERIPHERAL PORTION

PATTERN PORTION

EXPOSURE APPARATUS, EXPOSURE METHOD, AND DEVICE MANUFACTURING METHOD

BACKGROUND OF THE INVENTION

Field of the Invention

The present invention relates to an exposure apparatus, an exposure method, and a device manufacturing method.

Description of the Related Art

When a microdevice (a semiconductor element, a liquid crystal display element, or the like) is manufactured in a photolithography process, an exposure apparatus which exposes a substrate by projecting the pattern of a mask on the substrate is used. In order to project the pattern of the mask on the substrate precisely, the exposure apparatus is required to perform focus alignment (focus calibration) between the mask and the substrate accurately. One example of focus calibration methods includes a TTL (Through The Lens) method which measures the relative position of the substrate with respect to the mask and the focus position of the pattern of the mask via a projection optical system.

Figure 8:
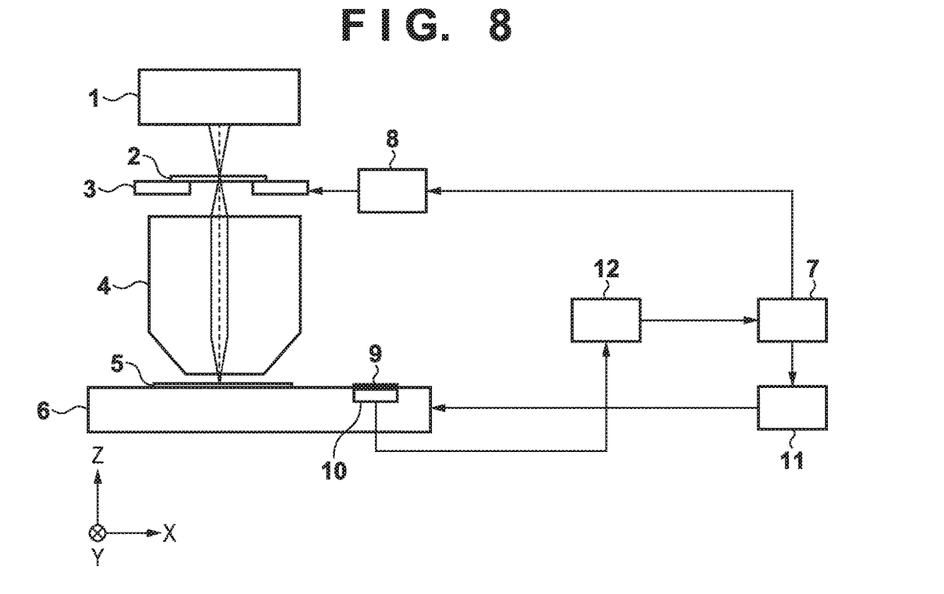
FIG. 8 is a view showing a conventional exposure apparatus having a focus calibration function in a TTL method.
Figure 9:
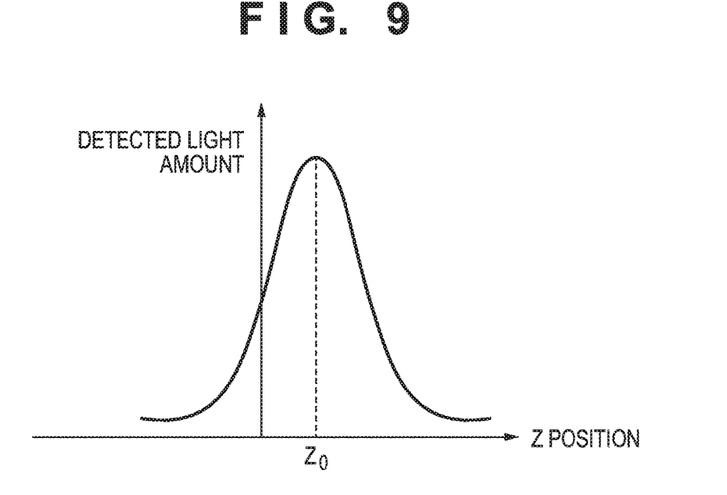
FIG. 9 is a graph showing an example in which the focus position is determined from the detected light amount.
Figure 10A:
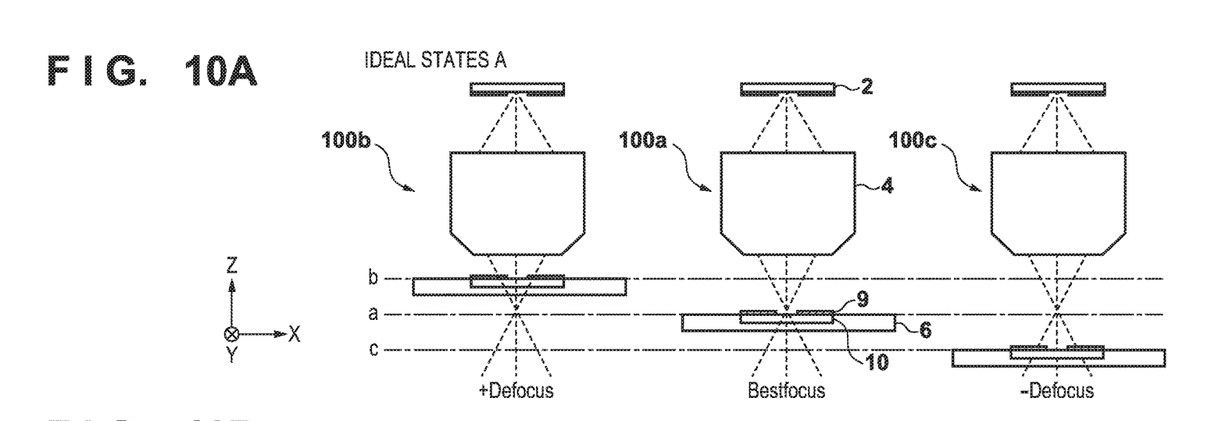
FIGS. 10A and 10B are views showing situations in which focus positions are obtained in an ideal state, and a state in which both a positional shift and telecentricity exist.
Figure 10B:
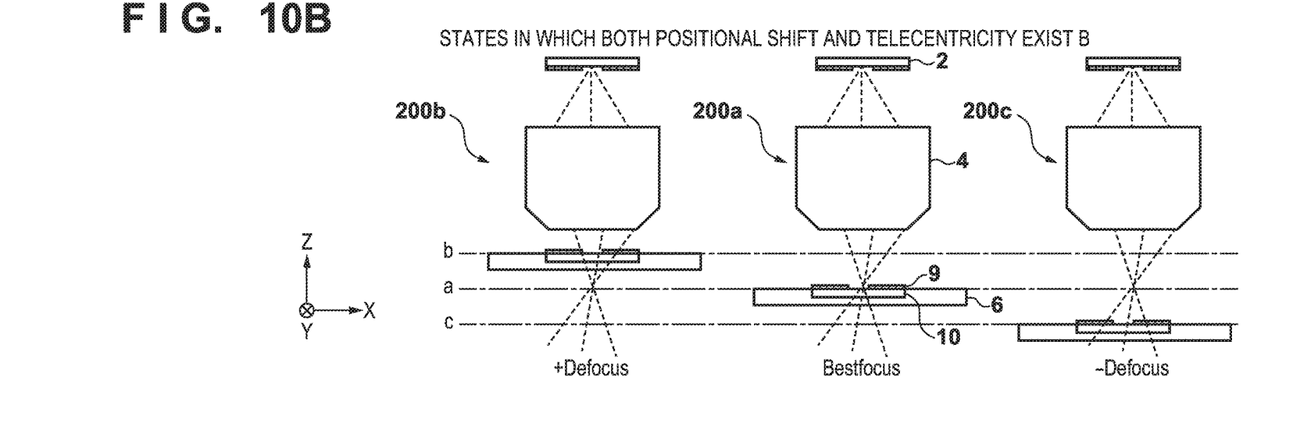

FIG. 8 is a schematic view showing an example of a conventional exposure apparatus having a focus calibration function in the TTL method. An example of focus calibration in the conventional exposure apparatus shown in FIG. 8 will be given. In order to illuminate a mask-side reference mark arranged on a mask 2 or mask stage 3 by an illumination optical system 1, a main controller 7 issues a command to a mask stage controller 8 and moves the mask stage 3. The main controller 7 issues a command to a substrate stage controller 11 and moves a substrate stage 6 such that a substrate-side reference mark 9 on the substrate stage 6 is arranged in correspondence with the mask-side reference mark. The main controller 7 drives the substrate stage 6 finely in the Z direction. A processor 12 calculates a coordinate position Z0 at which a detected light amount reaches its peak. FIG. 9 shows the relationship between the detected light amount and the coordinate position in the Z direction at this time. The position Z0 at which the detected light amount reaches its peak is obtained when the mask-side reference mark and the substrate-side reference mark 9 are in a conjugate positional relationship. A focus position is calculated by searching for the maximum value of that light amount. The processor 12 transmits calculated focus position information to the main controller 7. The main controller 7 can match the focus position of the pattern of the mask 2 with a substrate 5 by issuing a command to the substrate stage controller 11 and driving the substrate stage 6 in the Z direction by the shift amount of the focus position.

Japanese Patent Laid-Open No. 4-348019 discloses a method of calculating a focus position by illuminating a substrate-side reference mark, receiving reflected light of an image of a mask-side reference mark with a projection optical system via the projection optical system and the substrate-side reference mark, and detecting a change in that light amount.

Figure 11:
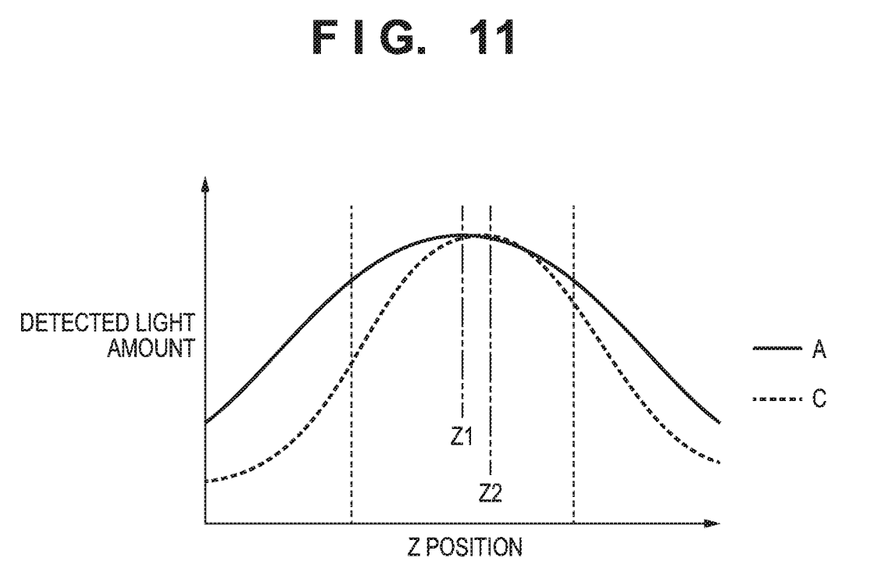
FIG. 11 depicts a graph showing the relationship between the position in the optical axis direction and the detected light amount in the ideal state and the state in which both the positional shift and telecentricity exist.

When measuring the focus position, however, both the positional shift between the position of the substrate-side reference mark 9 in the X and Y directions and the projection position of the measurement pattern (mask-side reference mark) of the mask in the X and Y directions, and substrate-side telecentricity of a projection optical system 4 exist. Telecentricity refers to a magnification error with respect to the depth direction of an object. In this case, the measurement value of the focus position is deviated. In FIG. 10A, 100a to 100c indicate ideal states A without any positional shift and telecentricity. In FIG. 10B, 200a to 200c indicate states B in which both the positional shift and telecentricity exist. Each of 100a of FIG. 10A and 200a of FIG. 10B indicates a state (Best Focus state) in which the focus position of the mask-side reference mark matches a position a of the substrate-side reference mark 9 in the Z direction. Each of 100b of FIG. 10A and 200b of FIG. 10B indicates a state (+Defocus state) in which the position of the substrate-side reference mark 9 in the Z direction is at a position b shifted in the plus direction with respect to the focus position of the mask-side reference mark. Each of 100c of FIG. 10A and 200c of FIG. 10B indicates a state (−Defocus state) in which the position of the substrate-side reference mark 9 in the Z direction is at a position c shifted in the minus direction with respect to the focus position of the mask-side reference mark. As shown in 200a of FIG. 10B, the state B indicates that the projection position of a measurement pattern in the X direction in the Best Focus state is shifted with respect to the center of the substrate-side reference mark 9 in the X direction, that is, the positional shift exists. FIG. 11 is a graph showing the relationship between the position in the Z direction and a light amount detected by a sensor 10 in the state A and the state B in FIGS. 10A and 10B. Curves A and C correspond to the states A and B, respectively. In FIGS. 11, Z1 and Z2 indicate measurement values of the focus positions measured in the state A and the state B, respectively, of FIGS. 10A and 10B. Between the state A and the state B of FIGS. 10A and 10B, different measurement values Z1 and Z2 of the focus positions calculated from FIG. 11 are obtained, though the focus positions are the same. That is, it is found that the measurement value of the focus position is deviated in the state B in which both the positional shift and telecentricity exist. Deviation of the measurement value never occurs as long as at least one of the positional shift and telecentricity can be set to zero. In practice, however, it is extremely difficult to zero even one of the positional shift and telecentricity. Further, even if telecentricity is zero, measurement deviation of the focus position occurs similarly if driving errors exist in the X and Y directions when the substrate stage 6 is driven in the Z direction.

SUMMARY OF THE INVENTION

To cope with this, it is an object of the present invention to provide an exposure apparatus which measures a focus position accurately.

According to one aspect of the present invention, there is provided an exposure apparatus that includes a projection optical system configured to project, on a substrate, a pattern of a mask held by a mask stage, a substrate stage movable in a first direction parallel to an optical axis of the projection optical system and a second direction perpendicular to the first direction and configured to hold the substrate, a measurement device configured to measure a light amount that is transmitted through a mask-side reference mark, the projection optical system, and a substrate-side reference mark arranged on the substrate stage, and a controller configured to determine a focus position of the projection optical system based on a measurement result of the measurement device. The apparatus comprises an obtaining unit configured to obtain information on a relationship between a moving amount of the substrate stage in the first direction and an amount of a positional shift in an image of the mask-side reference mark projected on the substrate-side reference mark by the projection optical system in the second direction with respect to the substrate-side reference mark, the amount of the positional shift occurring when the substrate stage is driven in the first direction. Where, the controller determines a focus position based on the measurement result by causing the measurement device to measure the light amount while, together with driving the substrate stage in the first direction, driving the substrate stage also in the second direction by the amount of the positional shift in the second direction corresponding to the moving amount of the substrate stage in the first direction by using the information.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

[Exposure Apparatus]

Figure 1:
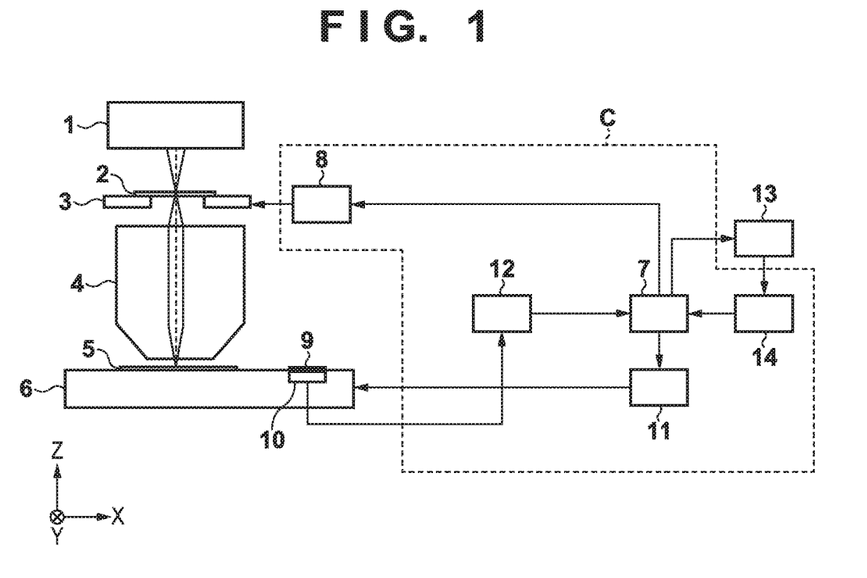
FIG. 1 is a view showing a scanning exposure apparatus according to the first embodiment.

FIG. 1 shows a scanning exposure apparatus having a focus calibration function in a TTL method of the present invention. First, a mode will be described in which scanning exposure is performed. As shown in FIG. 1, light emitted from an illumination optical system 1 is held by a mask stage 3, transmitted through a mask 2 where an actual device pattern (pattern) is drawn, and reaches a substrate 5 via a projection optical system 4. The pattern surface of the mask 2 and the substrate 5 are in a conjugate positional relationship by the projection optical system 4. Therefore, the pattern of the mask 2 is projected on the substrate 5 by the projection optical system 4. A substrate stage 6 that can move in the first direction (Z direction) parallel to the optical axis of the projection optical system 4 and the second directions (the X direction and the Y direction) perpendicular to it holds the substrate 5. The pattern of the mask 2 is projected and exposed on the substrate 5 by synchronously scanning the mask stage 3 and the substrate stage 6 in the Y direction of FIG. 1.

Figure 2:
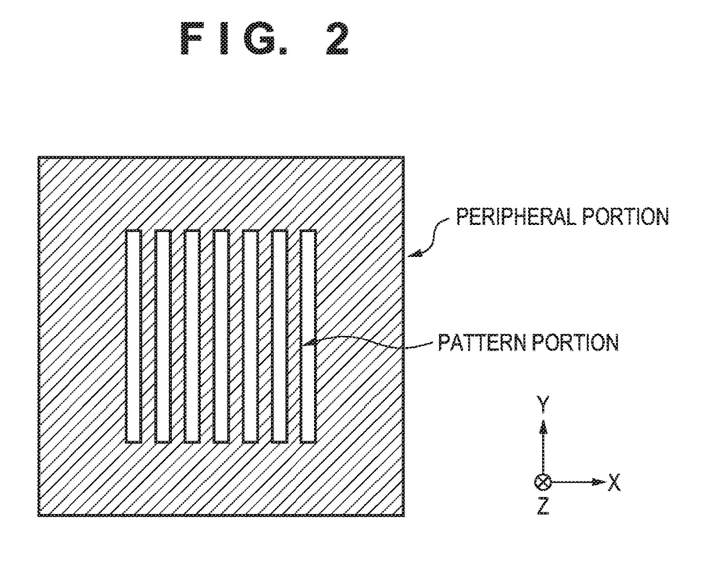
FIG. 2 is a view showing an example of a mask-side reference mark used for focus calibration.

An example of focus calibration is shown. In this embodiment, an obtaining unit 13 that obtains telecentricity information and a driving amount calculation unit 14 that calculates the driving amount of the substrate stage 6 in the X and Y directions from the telecentricity information are arranged, both of which do not exist in the related art. The obtaining unit 13 can obtain the telecentricity information by measurement inside the exposure apparatus or an external input. That is, the obtaining unit 13 may comprise a storage unit which stores the telecentricity information obtained in advance by using the substrate stage 6 and a sensor 10. Alternatively, the obtaining unit 13 may comprise an input unit to which a user inputs the telecentricity information. In this embodiment, a mode will be described below in which the telecentricity information is obtained and stored in advance inside the exposure apparatus, and the stored telecentricity information is utilized. In order to illuminate a measurement pattern (mask-side reference mark) arranged on the mask 2 by the illumination optical system 1, a main controller 7 issues a command to a mask stage controller 8 and moves the mask stage 3 in the X and Y directions by using an interferometer (not shown) or the like. The measurement pattern may be arranged not on the mask 2 but on the mask stage 3. FIG. 2 shows an example of the measurement pattern. The measurement pattern is made of a pattern portion having a predetermined line width and pitch through which light is transmitted, and a peripheral portion which shields the light.

The main controller 7 issues a command to a substrate stage controller 11, and moves the substrate stage 6 in the X and Y directions by using the interferometer (not shown) or the like such that a substrate-side reference mark 9 on the substrate stage 6 is arranged in correspondence with the measurement pattern on the mask 2. The substrate-side reference mark 9 is a transmission pattern corresponding to the measurement pattern on the mask 2. The sensor (measurement device) 10 is arranged under the substrate-side reference mark 9. The sensor 10 measures the light amount of light that is transmitted through both the measurement pattern and the substrate-side reference mark 9.

The main controller 7 issues a command to the substrate stage controller 11, drives the substrate stage 6 finely in the direction (for example, the X direction) perpendicular to the optical axis, and calculates, by a processor 12, a coordinate position X0 at which a detected light amount reaches its peak. The main controller 7, the processor 12, the mask stage controller 8, the substrate stage controller 11, and the driving amount calculation unit 14 form a controller C.

Figure 3:
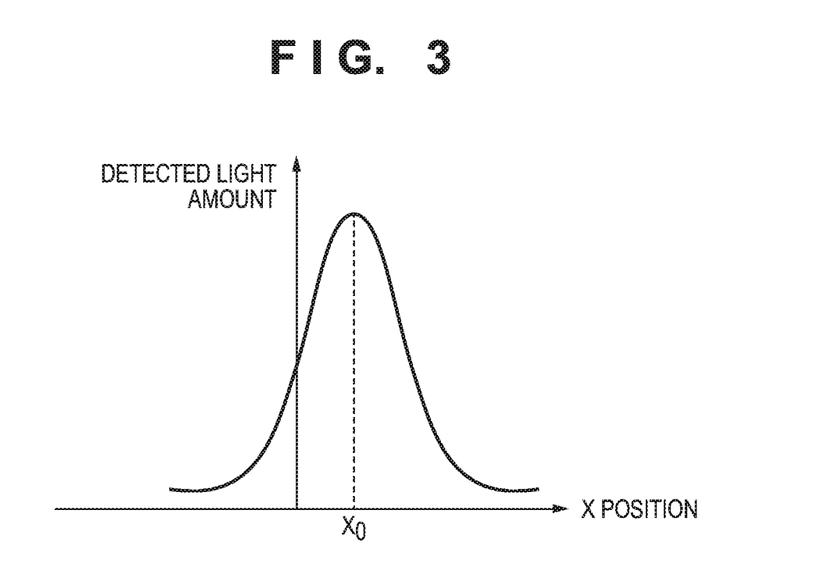
FIG. 3 is a graph showing an example in which a projection position in the X direction is calculated from a detected light amount.
Figure 4:
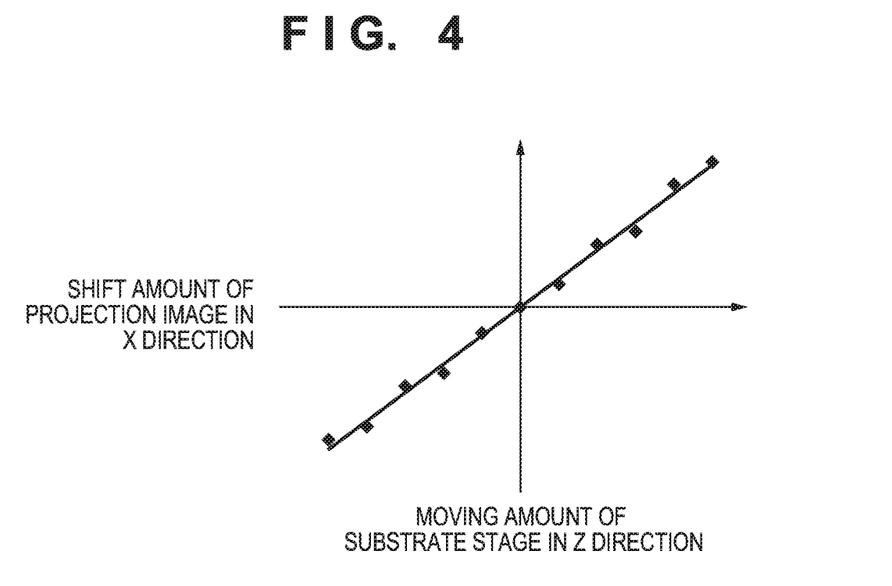
FIG. 4 is a graph showing an example in which telecentricity in the X direction is calculated from the Z position of a substrate stage and the projection position in the X direction.

FIG. 3 shows the relationship between the detected light amount and the X-direction position of the substrate stage 6. The position X0 at which the detected light amount reaches its peak becomes the projection position of the measurement pattern in the X direction. The main controller 7 drives the substrate stage 6 in the optical axis direction (Z direction) by a predetermined amount and calculates the projection position of the measurement pattern in the X direction similarly. By repeating the above-described procedure, it is possible to obtain the relationship between an amount of a positional shift in a projection image of the measurement pattern in the X direction (projection position) and the moving amount of the substrate stage 6 in the Z direction. FIG. 4 shows the relationship between the moving amount of the substrate stage 6 in the Z direction and the amount of the positional shift in the projection image of the measurement pattern in the X direction. Telecentricity Tx in the X direction can be expressed by:

$$Xm = Tx \times Zs \quad (1)$$

where Zs is a moving amount of the substrate stage 6 in the Z direction and Xm is an amount of the positional shift in the projection image in the X direction.

That is, a primary component of the amount of the positional shift in the projection image in the X direction with respect to the moving amount of the substrate stage 6 in the Z direction becomes telecentricity in the X direction. With the same method, telecentricity Ty in the Y direction can also be measured. In this embodiment, the relationship between the moving amount of the substrate stage 6 in the Z direction and the amount of the positional shift in the projection image is expressed by a proportional relationship. When the moving amount of the substrate stage 6 in the Z direction and the amount of the positional shift in the projection image are not in a simple proportional relationship, however, the relationship between the moving amount of the substrate stage 6 in the Z direction and the amount of the positional shift in the projection image may be expressed by a higher-order polynomial, a trigonometric polynomial, or another functional relation. A method of calculating the positional shift in the projection image with a method such as interpolation after storing both data in a map form such as a table obtained by associating them with each other may also be adopted. Telecentricity in this embodiment even includes a positional shift in the X and Y directions which is caused by the driving error of the substrate stage 6 obtained when the substrate stage 6 is driven in the Z direction. Furthermore, telecentricity in this embodiment can even include telecentricity of the illumination optical system 1 in addition to telecentricity of the projection optical system 4. In this embodiment, telecentricity is measured by measuring the focus position. However, telecentricity may be measured by another method. Telecentricity information in the X direction and the Y direction described above is input from the main controller 7 to the obtaining unit 13.

A mode will now be described in which focus calibration is performed in a state in which both the positional shift and telecentricity exist. As in the mode in which telecentricity is measured, each of the mask stage 3 and the substrate stage 6 is moved to a position capable of measuring the focus position. The substrate stage 6 is driven finely in the optical axis direction, and the sensor 10 arranged under the substrate-side reference mark 9 detects the light amount that is transmitted through the substrate-side reference mark 9. In this embodiment, the light amount is detected by driving the substrate stage 6 within a plane (X-Y plane) perpendicular to the optical axis simultaneously with driving the substrate stage 6 finely in the optical axis direction. Let Zf be a moving amount in the Z direction obtained when the substrate stage 6 is driven finely. Shift amounts (positional shift amounts) Sx and Sy in the X direction and the Y direction obtained when the substrate stage is driven finely in the Z direction by Zf can be calculated by:

$$Sx = Tx \times Zf \quad (2)$$

$$Sy = Ty \times Zf \quad (3)$$

where Tx and Ty represent telecentricity in the X direction and the Y direction input to the obtaining unit 13.

Figure 5:
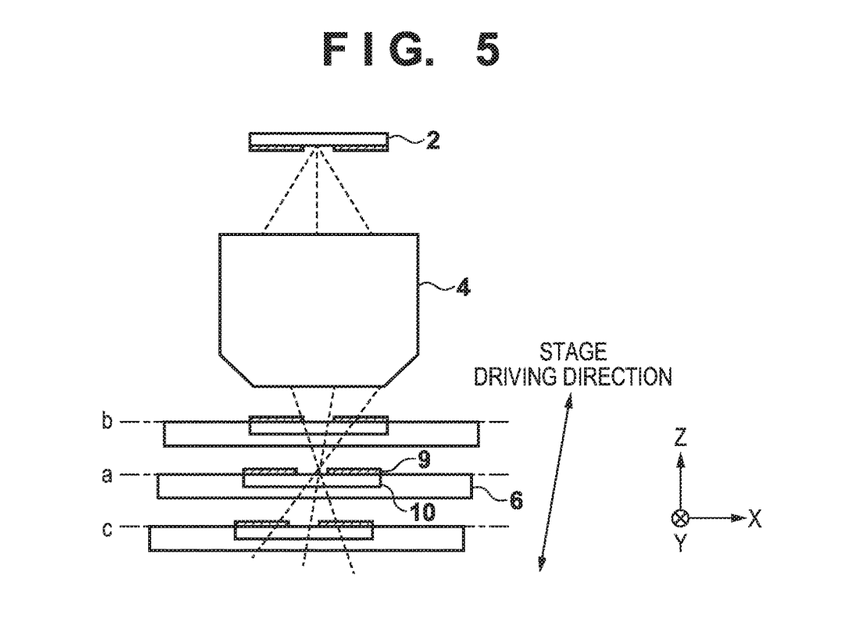
FIG. 5 is a view for explaining a method of driving the substrate stage when a focus position is determined according to the first embodiment.
Figure 6:
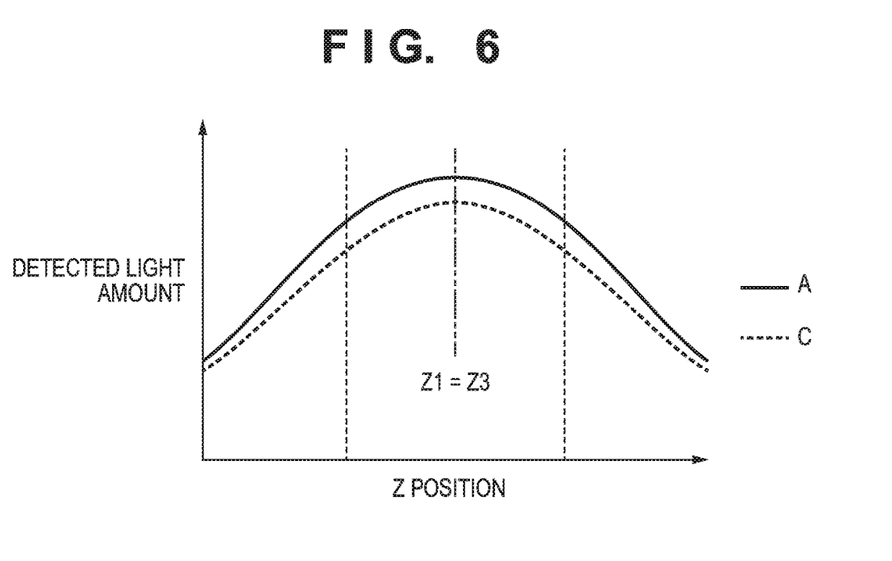
FIG. 6 depicts a graph showing the relationship between a position in an optical axis direction and the detected light amount in the first embodiment and an ideal state.

FIG. 5 is a view for explaining a method of driving the substrate stage 6 when a focus position is measured according to this embodiment. A driving direction of the substrate stage 6 is tilted relative to the optical axis (Z-axis). As in FIGS. 10A and 10B, positions a, b, and c in the Z direction of FIG. 5 correspond to the Best Focus state, +Defocus state, and -Defocus state, respectively. FIG. 6 is a graph showing the relationship between the Z position of the substrate stage 6 and the light amount detected by the sensor 10. A curve A indicates the relationship between the Z position of the substrate stage 6 and the light amount detected by the sensor 10 when the light amount is detected in an ideal state without any positional shift and telecentricity. A curve C indicates the relationship between the Z position of the substrate stage 6 and the light amount detected by the sensor 10 when the light amount is detected by driving the substrate stage 6 as in FIG. 5 in the state in which both the positional shift and telecentricity exist (this embodiment). The processor 12 determines, from FIG. 6, the Z position at which the detected light amount reaches its peak. The Z position at which the detected light amount reaches its peak is obtained when the measurement pattern of the mask 2 and the substrate-side reference mark 9 are in the conjugate positional relationship, and it is a focus position. Letting Z1 and Z3, respectively, be measurement values of the focus positions in the curve A and the curve C of FIG. 6, Z1=Z3 holds. Unlike the curve A, the positional shift exists in the curve C. Thus, the relationship between the Z position of the substrate stage and the light amount detected by the sensor 10 in the curve C is not the same as that in the curve A. However, the measurement values of the focus positions become equal to each other. Therefore, deviation of the measurement values of the focus positions caused by the positional shift and telecentricity does not occur even if the curve C is used. The focus positions are adjusted by causing the processor 12 to transmit information on the determined focus position Z3 to the main controller 7, and causing the main controller 7 to issue a command to the substrate stage controller 11 and drive the substrate stage 6 in the Z direction by the shift amount of the determined focus position. According to this embodiment, it becomes possible to provide the exposure apparatus which determines the focus position accurately based on the measurement result of the sensor even if both the positional shift and telecentricity exist.

[Exposure Method]

Figure 7:
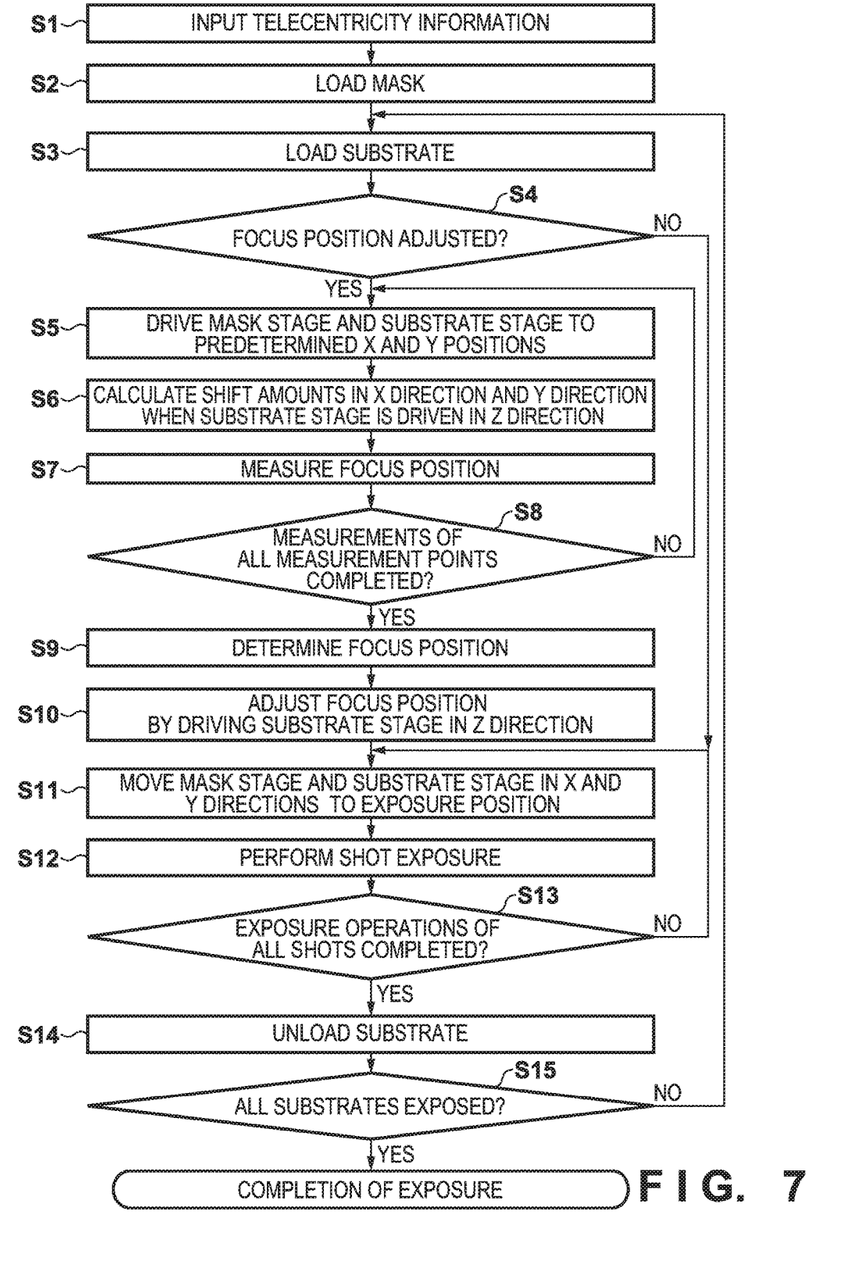
FIG. 7 is a flowchart showing an exposure method according to an embodiment of the present invention.

An exposure method according to an embodiment of the present invention will be described based on FIG. 7. FIG. 7 is a flowchart showing the exposure method according to an embodiment of the present invention. In the exposure method of FIG. 7, the exposure apparatus of FIG. 1 in the first embodiment is used. First, in step S1, the main controller 7 inputs pieces of telecentricity information in the X direction and the Y direction to the obtaining unit 13. The pieces of telecentricity information input here may be input for each measurement condition such as an illumination condition, the numerical aperture of the projection optical system, or a measurement point when the focus position is measured.

In step S2, the main controller 7 loads the mask 2 onto the mask stage 3. In step S3, the main controller 7 loads the substrate 5 onto the substrate stage 6. In step S4, the main controller 7 judges whether to correct the focus position. When the focus position is not corrected, the process advances to step S11, and the main controller 7 performs exposure. In order to illuminate the measurement pattern arranged on the mask 2 by the illumination optical system 1, the main controller 7 issues a command to the mask stage controller 8 and moves the mask stage 3 by using the interferometer (not shown) or the like in step S5. Further, the main controller 7 issues a command to the substrate stage controller 11 and moves the substrate stage 6 in the X and Y directions by using the interferometer (not shown) or the like such that the substrate-side reference mark 9 is arranged in correspondence with the measurement pattern on the mask 2.

In step S6, the driving amount calculation unit 14 calculates, from the pieces of telecentricity information input in step S1, the positional shift amounts in the X direction and the Y direction obtained when the substrate stage 6 is driven in the Z direction. Note that the positional shift amounts are calculated like equation (2) and (3) of the first embodiment. The main controller 7 obtains the focus position in step S7. The substrate stage 6 is driven finely in the Z direction and at the same time in the X direction and the Y direction by the positional shift amount calculated in step S6, and the sensor 10 arranged under the substrate-side reference mark 9 detects the light amount that is transmitted through the substrate-side reference mark 9. The processor 12 obtains the Z position at which the detected light amount reaches its peak.

In step S8, the main controller 7 judges whether measurements of the focus positions of all the measurement points are completed. Note that if each measurement condition includes the illumination condition or the numerical aperture of the projection optical system obtained when a focus position is measured in a portion other than the measurement point, the main controller 7 judges, in step S8, whether measurements of the focus positions on all the measurement conditions are completed. If the measurements are not completed, the process returns to step S5, and the focus position of the next measurement point is measured. If the measurements are completed, the process advances to step S9. In step S9, the processor 12 determines the focus positions. In this embodiment, there are a plurality of, for example, two measurement points of the focus positions, and they are denoted by measurement points A and B, respectively. However, the number of measurement points is not limited to this. Letting FA and FB, respectively, be focus positions of the measurement points A and B, the processor 12 determines a focus position CF by taking an average of the focus positions FA and FB of the measurement points A and B, as shown in:

$$CF=(FA+FB)/2 \quad (4)$$

An equation to determine the focus position CF is not limited to equation (4) as long as it is a function of FA and FB. In step S10, the focus positions are adjusted by causing the processor 12 to transmit the focus position CF determined in step S9 to the main controller 7, and causing the main controller 7 to issue a command to the substrate stage controller 11 and drive the substrate stage 6 in the Z direction by a difference from the focus position CF. In this embodiment, the focus positions are adjusted by driving the substrate stage 6. However, a method of adjusting the focus positions is not limited to this.

In step S11, the main controller 7 issues a command to each of the mask stage controller 8 and the substrate stage controller 11, and drives the mask stage 3 and the substrate stage 6 in the X and Y directions to move them to an exposure position. In step S12, the pattern on the mask 2 is projected and exposed on the substrate 5 via the projection optical system 4 by one shot by illuminating the mask 2 with light from the illumination optical system 1, and synchronously scanning the mask stage 3 and the substrate stage 6 in the Y direction. In step S13, the main controller 7 judges whether exposure operations of all shots are completed. If the exposure operations are not completed, the process returns to step S11, and the next shot is exposed. If the exposure operations are completed, the process advances to step S14 in which the main controller 7 unloads the substrate. In step S14, the main controller 7 unloads the substrate 5 where the exposure operations are completed from the substrate stage 6. In step S15, the main controller 7 judges whether pattern formation to all the substrates 5 is completed. If the formation is completed, exposure is completed. If the formation is not completed, steps from step S3 to step S14 are repeated. According to this embodiment, it becomes possible to perform focus calibration accurately even if both the positional shift and telecentricity exist.

[Device Manufacturing Method]

A method of manufacturing a device (a semiconductor device, a liquid crystal display device, or the like) according to an embodiment of the present invention will be described next. A semiconductor device is manufactured by performing a preprocess of forming an integrated circuit on a wafer, and a post-process of completing, as a product, the integrated circuit chip on the wafer formed by the preprocess. The preprocess includes a step of exposing, using the above-described exposure apparatus, a wafer to which a photoresist is applied, and a step of developing the wafer. The post-process includes an assembly step (dicing and bonding) and a packaging step (encapsulation). A liquid crystal display device is manufactured by performing a step of forming a transparent electrode. The step of forming the transparent electrode includes a step of applying a photoresist to a glass substrate on which a transparent conductive film is deposited, a step of exposing, using the above-described exposure apparatus, the glass substrate to which the photoresist is applied, and a step of developing the glass substrate. According to the device manufacturing method of this embodiment, it is possible to manufacture a device having quality higher than before. The embodiment of the present invention has been described above. However, the present invention is not limited to this embodiment, and various changes and modifications can be made within its spirit and scope.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-142386, filed Jul. 16, 2015, which is hereby incorporated by reference herein in its entirety.

What is claimed is:

1. An exposure apparatus that includes a projection optical system configured to project, on a substrate, a pattern of a mask held by a mask stage, a substrate stage movable in a first direction parallel to an optical axis of the projection optical system and a second direction perpendicular to the first direction and configured to hold the substrate, a measurement device configured to measure a light amount that is transmitted through a mask-side reference mark, the projection optical system, and a substrate-side reference mark arranged on the substrate stage, and a controller configured to determine a focus position of the projection optical system based on a measurement result of the measurement device, the apparatus comprising:
   an obtaining unit configured to obtain information on a relationship between a moving amount of the substrate stage in the first direction and an amount of a positional shift in an image of the mask-side reference mark projected on the substrate-side reference mark by the projection optical system in the second direction with respect to the substrate-side reference mark, the amount of the positional shift occurring when the substrate stage is driven in the first direction,
   wherein the controller determines a focus position based on the measurement result by causing the measurement device to measure the light amount while, together with driving the substrate stage in the first direction, driving the substrate stage also in the second direction by the amount of the positional shift in the second direction corresponding to the moving amount of the substrate stage in the first direction by using the information.

2. The apparatus according to claim 1, wherein the obtaining unit is an input unit to which a user inputs the information.

3. The apparatus according to claim 1, wherein the obtaining unit comprises a storage unit configured to store the information obtained in advance by using the substrate stage and the measurement device.

4. The apparatus according to claim 1, wherein the positional shift includes a positional shift caused by at least one of telecentricity of the projection optical system and a driving error of the substrate stage.

5. The apparatus according to claim 4, further comprising an illumination optical system configured to illuminate the mask,
   wherein the positional shift further includes a positional shift caused by telecentricity of the illumination optical system.

6. The apparatus according to claim 1, wherein the information is expressed by a relation between the amount of the positional shift and the moving amount of the substrate stage in the first direction.

7. The apparatus according to claim 6, wherein the amount of the positional shift and the moving amount of the substrate stage in the first direction are in a proportional relationship.

8. The apparatus according to claim 1, wherein the information is expressed by a table obtained by associating data on the amount of the positional shift and data on the moving amount of the substrate stage in the first direction with each other.

9. The apparatus according to claim 1, wherein the mask-side reference mark is arranged on one of the mask and the mask stage.

10. The apparatus according to claim 1, wherein the mask-side reference mark comprises a plurality of mask-side reference marks arranged on one of the mask and the mask stage, and
    the controller obtains a focus position of the projection optical system for each of the plurality of mask-side reference marks and determines the focus position based on the obtained plurality of focus positions.

11. The apparatus according to claim 10, wherein the controller determines the focus position by taking an average of the obtained plurality of focus positions.

12. An exposure method of exposing a substrate by an exposure apparatus that includes a projection optical system configured to project, on the substrate, a pattern of a mask held by a mask stage, a substrate stage movable in a first direction parallel to an optical axis of the projection optical system and a second direction perpendicular to the first direction and configured to hold the substrate, and a measurement device configured to measure a light amount that is transmitted through a mask-side reference mark, the projection optical system, and a substrate-side reference mark arranged on the substrate stage, the method comprising:
    obtaining information on a relationship between a moving amount of the substrate stage in the first direction and an amount of a positional shift in an image of the mask-side reference mark projected on the substrate-side reference mark by the projection optical system in the second direction with respect to the substrate-side reference mark, the amount of the positional shift occurring when the substrate stage is driven in the first direction, and
    determining a focus position of the projection optical system based on the measurement result by causing the measurement device to measure the light amount while, together with driving the substrate stage in the first direction, driving the substrate stage also in the second direction by the amount of the positional shift in the second direction corresponding to the moving amount of the substrate stage in the first direction by using the information.

13. The method according to claim 12, wherein the mask-side reference mark comprises a plurality of mask-side reference marks arranged on one of the mask and the mask stage, and
    the determining comprises obtaining a focus position of the projection optical system for each of the plurality of mask-side reference marks and determining the focus position based on the obtained plurality of focus positions.

14. A device manufacturing method comprising:
    exposing a substrate by using an exposure apparatus; and
    developing the substrate exposed in the exposing,
    wherein the exposure apparatus including a projection optical system configured to project, on the substrate, a pattern of a mask held by a mask stage, a substrate stage movable in a first direction parallel to an optical axis of the projection optical system and a second direction perpendicular to the first direction and configured to hold the substrate, a measurement device configured to measure a light amount that is transmitted through a mask-side reference mark, the projection optical system, and a substrate-side reference mark arranged on the substrate stage, and a controller configured to determine a focus position of the projection optical system based on a measurement result of the measurement device, the apparatus includes an obtaining unit configured to obtain information on a relationship between a moving amount of the substrate stage in the first direction and an amount of a positional shift in an image of the mask-side reference mark projected on the substrate-side reference mark by the projection optical system in the second direction with respect to the substrate-side reference mark, the amount of the positional shift occurring when the substrate stage is driven in the first direction, and the controller determines a focus position based on the measurement result by causing the measurement device to measure the light amount while, together with driving the substrate stage in the first direction, driving the substrate stage also in the second direction by the amount of the positional shift in the second direction corresponding to the moving amount of the substrate stage in the first direction by using the information.

* * * * *